United States Patent [19]

Tomlinson, Jr.

[11] 4,240,116
[45] Dec. 16, 1980

[54] SOLID STATE IMAGING APPARATUS

[75] Inventor: Harold W. Tomlinson, Jr., Milford, Conn.

[73] Assignee: General Electric Company, Schenectady, N.Y.

[21] Appl. No.: 68,631

[22] Filed: Aug. 22, 1979

[51] Int. Cl.³ .................... H01J 39/12; H04N 3/14
[52] U.S. Cl. .................................. 358/213; 357/24; 357/32; 307/304; 250/211 J
[58] Field of Search ............... 358/213, 241, 298; 357/24, 30, 32; 307/304; 250/211 J, 211 R, 553; 340/166 R; 365/183, 114

[56] References Cited

U.S. PATENT DOCUMENTS

| | | | |
|---|---|---|---|
| 3,935,446 | 1/1976 | Michon | 250/211 J |
| 3,988,613 | 10/1976 | Brown et al. | 250/211 J |
| 3,993,897 | 11/1976 | Burke | 250/211 J |
| 4,000,418 | 12/1976 | Waldron | 250/211 J |
| 4,011,441 | 3/1977 | Michon et al. | 357/24 |
| 4,129,887 | 12/1978 | Michon | 358/213 |

Primary Examiner—Robert L. Richardson
Assistant Examiner—Tommy P. Chin
Attorney, Agent, or Firm—Julius J. Zaskalicky; James C. Davis, Jr.; Marvin Snyder

[57] ABSTRACT

An array of charge storage devices each including a pair of closely coupled conductor-insulator-semiconductor cells, one a row line connected cell and the other a column line connected cell, is provided on a common semiconductor substrate. Readout of the charges stored in each row of devices of one set of alternate rows is accomplished by transferring the charge in each of the devices of each of the rows in one direction between the row line connected cell and the column line connected cell of a device in sequence and sensing the resultant current flow in each of the row lines of the set. Readout of the charges in each row of devices of the other set of alternate rows is accomplished by transferring the charge in each of the devices of each of the rows in the other direction between the row line connected cell and the column line connected cell of a device in sequence and sensing the resultant current flow in each of the row lines of the set.

1 Claim, 32 Drawing Figures

SOLID STATE IMAGING APPARATUS

The present invention relates to apparatus including devices and circuits therefor for sensing patterns of radiation imaged thereon and developing electrical signals in accordance therewith. The present invention relates in particular to such apparatus which stores charge produced by electromagnetic radiation flux in the form of localized charges in a semiconductor substrate and which provides an electrical readout of the stored charge.

This application relates to improvements in the apparatus of U.S. Pat. Nos. 3,993,897 and 4,000,418, and copending patent application Ser. No. 060,850, filed July 26, 1979, all of which are assigned to the assignee of the present application.

A general object of the present invention is to provide improvements in solid state imaging apparatus.

Another object of the present invention is to simplify the structure and organization of solid state imaging apparatus and improve the performance thereof.

Another object of the present invention is to reduce the signal processing bandwidth requirement for a given rate of picture element readout of the array.

A further object of the present invention is to increase the dynamic range of solid state imaging apparatus.

In carrying out the invention in one illustrative embodiment thereof there is provided a substrate of semiconductor material of one conductivity type having a major surface. A plurality of first conductive plates are provided, each overlying and in insulated relationship to the major surface and forming a first conductor-insulator-semiconductor capacitor with the substrate. A plurality of second conductive plates are provided, each adjacent a respective first conductive plate to form a plurality of pairs of plates, the pairs of plates being arranged in a matrix of rows and columns, each of the second conductive plates overlying and in insulated relationship to the major surface and forming a second conductor-insulator-semiconductor capacitor with the substrate. Each second conductor-insulator-semiconductor capacitor is coupled to a respective first conductor-insulator-semiconductor capacitor so as to permit the transfer of stored charge between them. A plurality of row conductor lines are provided. The first conductive plates in each of the rows are connected to a respective row conductor line. A plurality of column conductor lines are provided. The second conductive plates in each of the columns are connected to a respective column conductor line.

A first voltage means provides a first voltage between the row conductor lines and the substrate to deplete the first portions of the substrate lying under the first conductive plates of majority charge carriers and provides an absolute potential of a first value therein. A second voltage means provides a second voltage between the column conductor lines and the substrate to deplete the second portions of the substrate lying under the second conductive plates of majority charge carriers and provides an absolute potential of a second value therein. Preferably, the second value of potential is greater than the first value of potential. Means are provided for storing charge in the first and second portions of the substrate.

Means are provided for addressing each pair of adjacent rows in sequence during a respective first period of time, each row being included in two successive pairs of rows whereby each row is addressed during an initial first period and also during a succeeding first period thereof, Each of the lines of an addressed pair of rows is provided with the aforementioned first voltage during the initial first period thereof and with a zero reference potential during the succeeding first period thereof. The column lines are set at zero reference voltage at the beginning of the initial first period of a row of the addressed pair, and the preceding row of the addressed pair is reduced to zero reference potential at the beginning of the initial first period of said one row to cause charge in the first storage regions of the preceding row to be injected simultaneously into the substrate.

Means are provided for increasing the aforementioned second voltage on each of said column conductor lines in sequence during the initial first period of the one row when the row line thereof is at the first voltage and the preceding row line of the pair is at zero reference potential to deplete a respective pair of second portions of the substrate lying thereunder of majority charge carriers to provide an absolute potential in the second portions of the second value therein. Thus, charge stored in the first portions of said row of the addressed pair of rows is transferred in sequence into respective second portions thereof and produces a video signal of one polarity on the row line thereof and another video signal of the one polarity is produced on the preceding row line of the addressed pair.

Means are provided for decreasing the second voltage on each of the column conductor lines in sequence during an initial first period of a succeeding row of a succeeding addressed pair of rows to zero reference potential when the row line thereof is at the first voltage and the one row line is at zero reference potential. Thus, charge stored in the second portions of the succeeding row is transferred in sequence into respective first portions thereof and produces a video signal of opposite polarity on the row line thereof and another video signal of the opposite polarity is produced on the one row line. The one row line is at said zero reference potential and each of said column conductor lines is reduced in sequence to zero reference potential causing charge in each of the second storage regions of the one row to be injected in sequence into said substrate.

Means are provided for sensing in sequence the signals induced on each of the row lines of the addressed pair during the transfer of charge from the second portions to the first portions of the substrate associated therewith. Means are provided for obtaining a difference signal for each pair of signals appearing on the row lines of the addressed pair of rows.

The novel features which are believed to be characteristic of the present invention are set forth with particularity in the appended claims. The invention itself, both as to its organization and method of operation, together with further objects and advantages thereof may best be understood by reference to the following description taken in connection with the accompanying drawings wherein:

Before proceeding to describe the apparatus of FIG. 6 embodying the present invention an array 10 of charge storage and radiation sensing devices used in the apparatus and shown in FIGS. 1-5 will be described. Such image sensing arrays are described in U.S. Pat. No. 3,988,613. The image sensing array 10 includes a plurality radiation sensing devices 11 each of which includes a first or row CIS (Conductor-Insulator-Semiconductor) charge storage capacitor 12 of generally rectangular outline and a pair of column CIS charge storage capacitors 14 and 15, collectively designated as a second charge storage capacitor, also of generally rectangular outline, each adjacent a respective side of the row CIS charge storage capacitor 12. The plate or conductor 13 of capacitor 12 is connected to and integral with a row conductor line of the row in which the device is located. The plates or conductors 16 and 17 of capacitors 14 and 15 are connected to and are integral with the column conductor line of the column in which the device is located. The radiation sensing devices 11 are arranged in four rows and four columns. The array includes four row conductor lines, each connecting the row plates of a respective row of devices, and are designated from top to bottom $X_1$, $X_2$, $X_3$ and $X_4$. The array also includes four column conductor lines orthogonally oriented with respect to the row conductor lines, each connecting the column plates of a respective column of devices, and are designated from left to right $Y_1$, $Y_2$, $Y_3$ and $Y_4$. The row lines are constituted of a light transmissive conductive material, such as doped polycrystalline silicon and the column lines are also constituted of the same light transmissive conductive material, doped polycrystalline silicon. Conductive connections are made to the row lines $X_1$-$X_4$ through conductive landings or contacts 18 provided at both ends of each of the row lines. Conductive connections are made to the column lines $Y_1$-$Y_4$ through conductive landings or contacts 19 provided at both ends of each of the column lines.

The array includes a substrate or wafer 21 of silicon semiconductor material having a high resistivity layer 21a of N type conductivity epitaxially formed on a low resistivity base layer 21b of P type conductivity. The layer 21a has a major surface 22 in which are provided a plurality of surface regions 23. The surface regions 23 are arranged in a plurality of rows and columns. The surface regions 23 are of substantially identical area and outline. As shown, the surface regions 23 are of generally rectangular outline with the long sides parallel to the row direction and the short sides parallel to the column direction. A thick layer 24 of light transmissive insulating material such as silicon dioxide overlies the major surface and has a plurality of thin portions 25, each in registry with a respective one of the surface regions 23. The thin portions are provided by forming deep recesses 26 in the thick insulating layer. Thus, the insulating layer 24 includes thick or ridge portions 27 surrounding a plurality of thin portions 25 in the bottoms of the recesses 26. A plurality of row conductor lines $X_1$-$X_4$ each of the same and uniform width are provided overlying the layer of insulation. Each row conductor line being in traversing relationship to the surface regions 23 of a respective row of surface regions and overlying fixed first portions of the surface region of the respective row. The portions of the row conductor lines overlying the surface regions 23 constituting the conductors of a plurality of first conductor-insulator-semiconductor capacitors formed with the insulating layer 25 and the substrate 21. A plurality of column conductor lines $Y_1$-$Y_4$ each of the same and uniform width are provided insulatingly overlying the row conductor lines. Each column conductor line being in traversing relationship to the surface regions 23 of a respective column of surface regions and overlying entirely the surface regions of the respective column. The portions of the column conductor lines overlying the surface regions not shielded or masked by the row conductor lines constituting the split conductors 16 and 17 of a plurality of second conductor-insulator-semiconductor capacitors formed with the thin portions 25 of the insulating layer and the substrate. Each second conductor-insulator-semiconductor capacitor includes a pair of capacitors 14 and 15 both of which are coupled to a respective first conductor-insulator-semiconductor capacitor 12.

A thin insulating layer 31 of silicon dioxide surrounds the row lines $X_1$-$X_4$ of polycrystalline silicon. A thin layer of silicon nitride 32 is provided between the column lines $Y_1$-$Y_4$ and the row lines $X_1$-$X_4$. A thin layer of silicon dioxide 35 is formed over the upper face of the array including the column conductor lines $Y_1$-$Y_4$.

Figure 1:
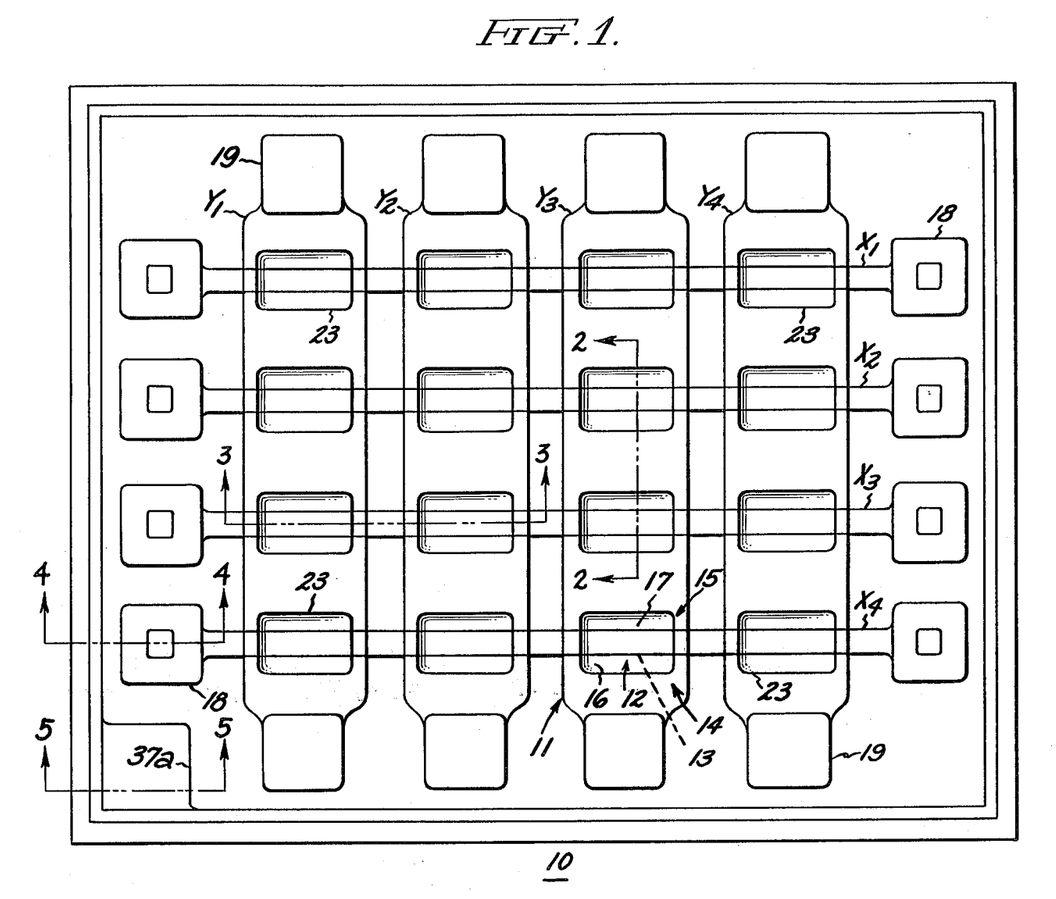
FIG. 1 is a plan view of an array or assembly of charge storage devices incorporated in the apparatus of the present invention shown in FIG. 6.
Figure 2:
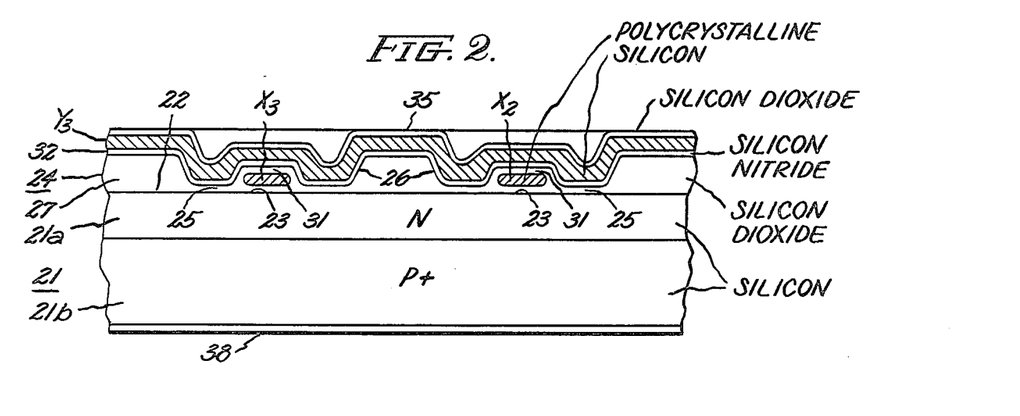
FIG. 2 is a sectional view of the assembly of FIG. 1 taken along section lines 2—2 of FIG. 1.
Figure 3:
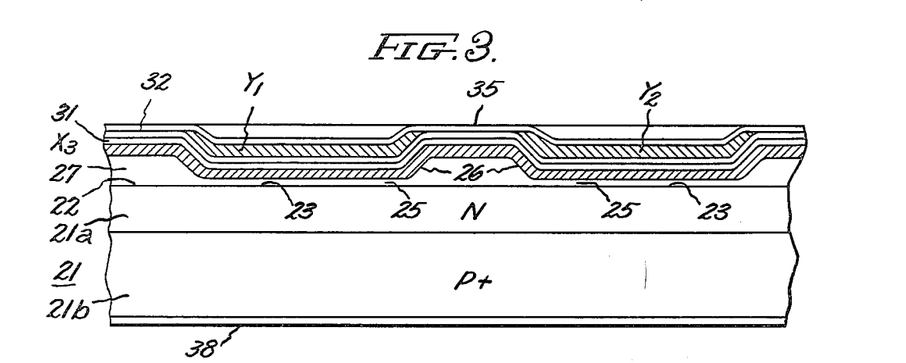
FIG. 3 is a sectional view of the assembly of FIG. 1 taken along section lines 3—of FIG. 1.
Figure 4:
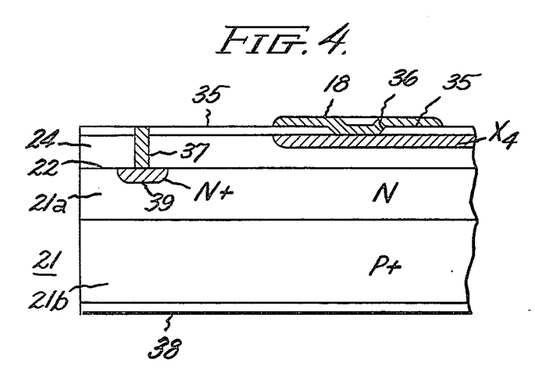
FIG. 4 is a sectional view of the assembly of FIG. 1 taken along section lines 4—4 of FIG. 1.
Figure 5:
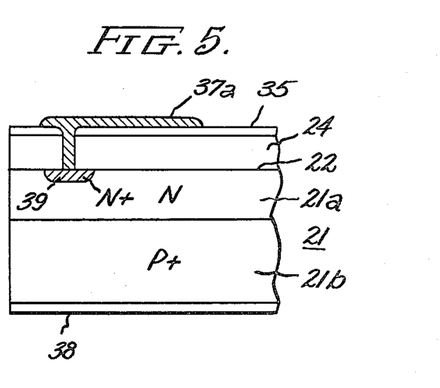
FIG. 5 is a sectional view of the assembly of FIG. 1 taken along section lines 5—5 of FIG. 1.

The contacts 18 to the polycrystalline silicon row lines are made through openings 36 in the protective layer 35 as shown in FIG. 4 filled with a conductor such as aluminum. The aluminum is sintered to provide good bonds to the polycrystalline silicon lines $X_1$-$X_4$. The contacts 19 of aluminum for the column lines are similarly made to the column lines $Y_1$-$Y_4$. To provide conductive connection to the epitaxial layer 21a an opening 37 is made in the silicon dioxide layers 24 and 35 in registry with an N+ surface adjacent region 39 around the periphery of the layer 21a as shown in FIG. 5. The opening is filled with a conductor such as aluminum which is sintered to N+ region and terminated in contact 37a. A conductive electrode 38 of a suitable material such as aluminum is applied to the other major face of the substrate 21 to provide an ohmic connection thereto.

The array 10 and the devices 21 of which they are comprised may be fabricated using a variety of materials and in variety of sizes in accordance with established techniques for fabricating integrated circuits as described in the aforementioned U.S. Pat. Nos. 3,988,613 and 3,993,897.

Figure 6:
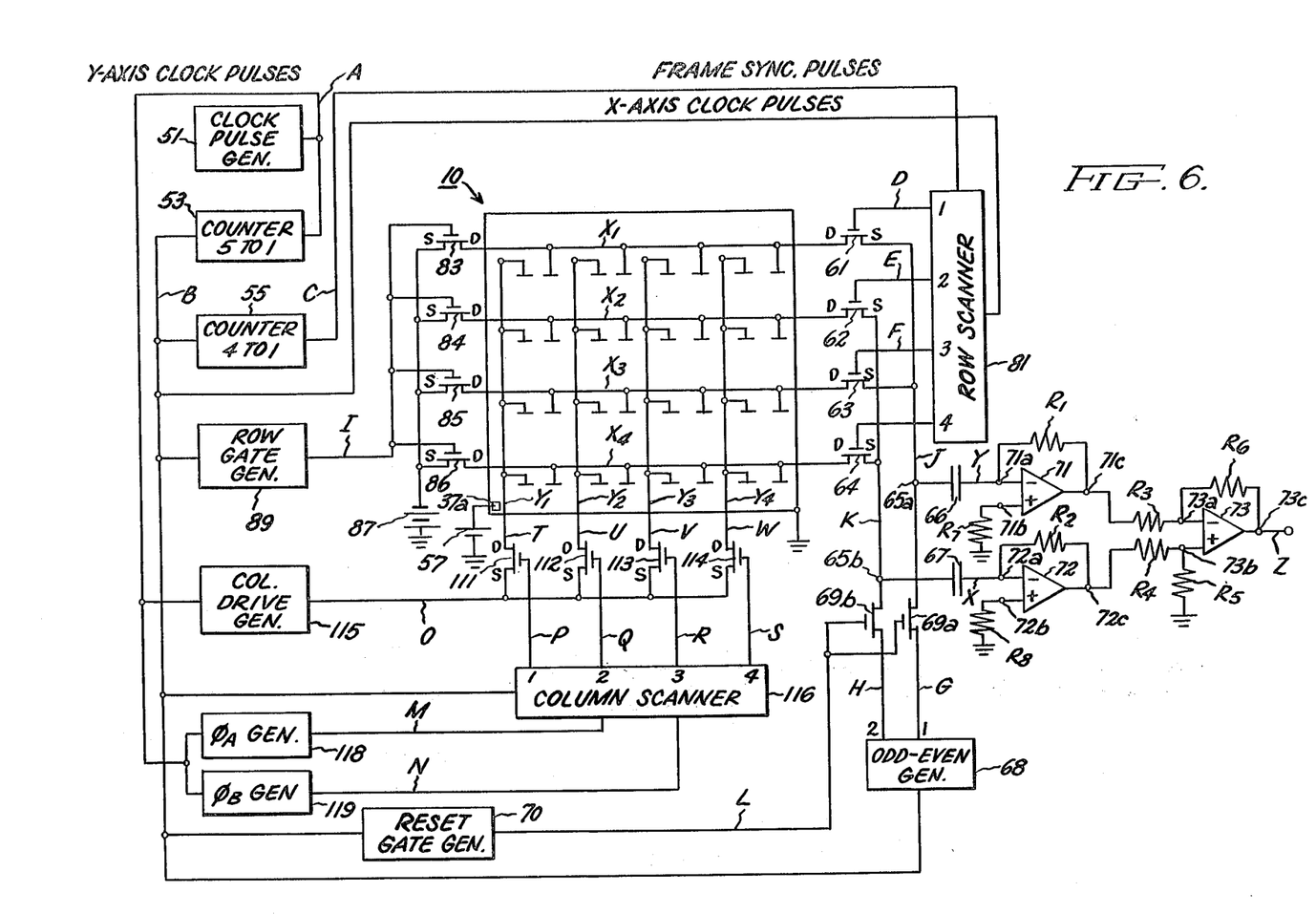
FIG. 6 is a block diagram of an image sensing apparatus in accordance with the present invention.

Referring now to FIG. 6 there is shown a block diagram of apparatus, utilizing the charge storage array of FIGS. 1-5, which provides a video signal in response to radiation imaged on the array by a lens system (not shown), for example.

The apparatus will be described in connection with FIGS. 7A-7Z which show diagrams of amplitude versus time of signals occurring at various points in the apparatus of FIG. 6. The point of occurrence of a signal of FIGS. 7A-7Z is referenced in FIG. 6 by a literal designation corresponding to the literal designation of the figure reference.

Figure 7A:
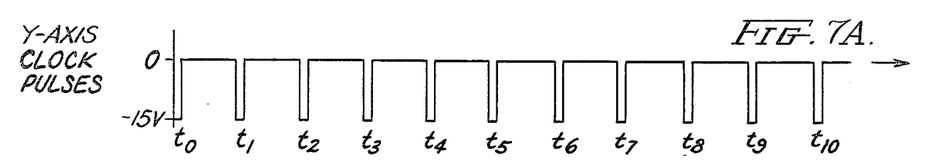
FIGS. 7A-7Z are diagrams of amplitude versus time of voltages and currents occurring at various points in the apparatus of FIG. 6. The point of occurrence of a signal of FIGS. 7A-7Z in the block diagram of FIG. 6 is identified in FIG. 6 by a literal designation corresponding to the literal designation of the FIGS. 7A-7Z.
Figure 7B:
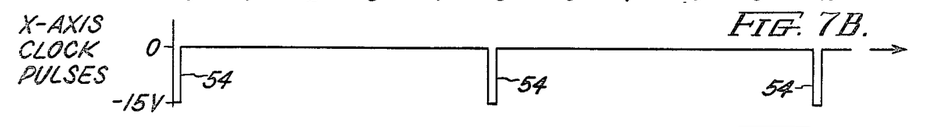

The apparatus includes a clock pulse generator 51 which develops a series of regularly occurring Y-axis pulses 52 of short duration shown in FIG. 7A, occurring in sequence at instants of time $t_0$-$t_{10}$ and representing a half scanning cycle of operation of the array. The output of the clock pulse generator 51 is applied to a first counter 53 which divides the count of the clock pulse generator by five to derive X-axis clock pulses 54, such as shown in FIG. 7B. The output of the first counter 53 is also applied to a second counter 55 which further divides the count applied to it by four to provide frame synchronizing pulses 56 to the array.

The sensing array 10, which is identical to the sensing array of FIGS. 1-5 and is identically designated, includes row conductor lines $X_1$-$X_4$ and the column conductor lines $Y_1$-$Y_4$. The drive circuits for the row conductor lines $X_1$-$X_4$ and for the column conductor lines $Y_1$-$Y_4$ of array 10 are included on the same substrate 21 as the array to minimize the number of external connections which are required to be made for connection of the array 10 into the apparatus.

In the operation of the apparatus the epitaxial layer 21a is biased by a source 57 at a small positive voltage, for example 2 volts, with respect to the P type layer 21b so that charge injected into layer 21a from a scanned row of devices is rapidly removed from this layer and recollection thereof avoided on reestablishment of storage voltages on the devices of that row. Such a structure enables the array to be operated at higher speeds as injected charge is rapidly removed from the epitaxial layer. Injection of stored charge in a device is accomplished by raising the row connected plate and the column connected plate thereof to zero volts for a short period of time. During injection of stored charge, as the plates of the device are at a small negative voltage with respect to the layer 21a, a bias charge is retained in the device. Operating the array with such bias charge eliminates noise which would be produced by the emptying and filling of the surface states of the layer 21a in operation.

To enable selective readout of a row of devices a plurality of row enable switches 61-64 are provided. The row-enable switches 61-64 are in the form of MOS-FET transistor devices formed integrally on the substrate, each having a source electrode, a drain electrode and a gate electrode. Each of the drains of devices 61-64 is connected to one end of a respective one of the row conductor lines $X_1$-$X_4$. Each of the sources of the devices 61 and 63 is connected to row bias terminal 65a. Each of the sources of devices 61 and 62 is connected to row bias terminal 65b.

The output terminal 65a is connected through a coupling capacitor 66 to the inverting terminal 71a of differential amplifier 71, the non-inverting terminal 71b of which is connected to ground through a resistance $R_7$. The output terminal 65b is connected through coupling capacitor 67 to the inverting terminal 72a of differential amplifier 72, the non-inverting terminal 72b of which is connected to ground through a resistance $R_8$. (A change in voltage at the inverting terminal of a differential amplifier in one direction in relation to a referenced potential produces a change in voltage at the output terminal in the opposite direction in relation to the referenced potential. A change in voltage at the non-inverting terminal in one direction in relation to a referenced potential produces a change in voltage at the output terminal in the same direction in relation to the referenced potential.) Feedback resistor $R_1$ connected between the output terminal 71c and the input terminal 71a of differential amplifier 71 provides a voltage signal at output terminal 71c in response to a current signal appearing at input terminal 71a. Similarly, feedback resistor $R_2$ connected between the output terminal 72c and input terminal 72a of differential amplifier 72 provides an output voltage at output terminal 72c corresponding to a current input at input terminal 72a.

A differential amplifier 73 having an inverting terminal 73a, a non-inverting terminal 73b and an output terminal 73c is provided for obtaining the difference in the signals appearing at the output terminal 71c and 72c of differential amplifiers 71 and 72, respectively. Output terminal 71c is connected through a series resistance $R_3$ to the inverting input terminal 73a and the output terminal 72c is connected through series resistance $R_4$ to the non-inverting input terminal 73b. Resistance $R_5$ is connected between the non-inverting terminal 73b and a ground and feedback resistance $R_6$ is connected between the output terminal 73c and the input terminal 73a. Thus, at the output terminal 73c appears a voltage signal corresponding to the difference in outputs at terminals 71c and 72c.

The gate electrodes of the transistor 61-64 are connected to successive output terminals of the row shift register 81, numbered respectively 1, 2, 3 and 4. The outputs at terminals 1, 2 and 3 of the row shift register are shown, respectively, in FIGS. 7D, 7E and 7F. The output at terminal 4 is similar to output of terminal 3 except appropriately delayed in time to occur during the fourth row line and first scan periods. The input to row shift register 81, referred to as the frame sync pulse, is the pulse obtained at the output of the second counter 55. One frame sync pulse occurs for every twenty Y-axis clock pulses. Oppositely phased clock drive pulses for the row shift register 81 are derived from the X-axis clock pulses. The oppositely phased drive pulses are applied to each of the stages of the row shift register 81 to produce the indicated outputs at the terminals 1-4 thereof. The row shift register 81 may be any of a number of shift registers known to the art. The elements of the shift register 81 may be formed on the substrate at the same time that the devices of the array 10 are formed.

Figures 7C, 7D:
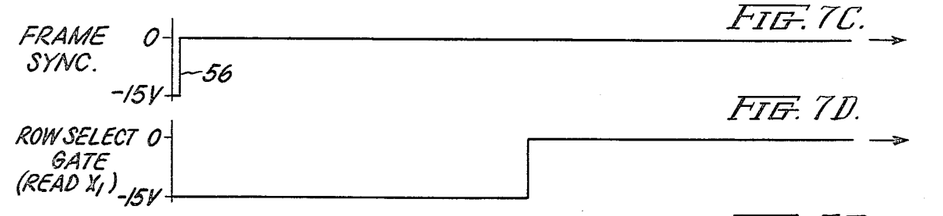
Figures 7E, 7F:
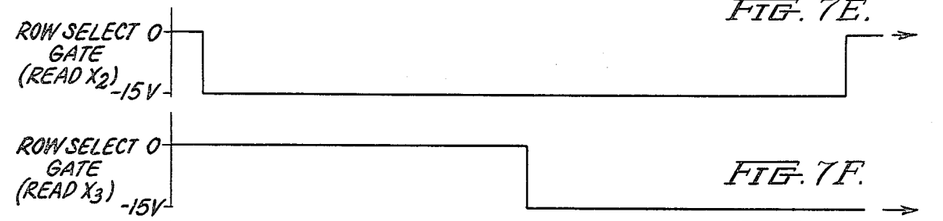

During the occurrence of the gating pulses of FIG. 7D and 7E on terminals 1 and 2 of the row scanner 81, transistors 61 and 62 are turned on, connecting row line $X_1$ to terminal 65a and connecting row line $X_2$ to terminal 65b. Prior to the instant of time $t_0$, the devices of row $X_1$ have been read out and prior to time $t_1$ the charge stored in these devices has been simultaneously injected into the substrate.

Readout of the devices is accomplished by application of the voltage waveforms shown in FIGS. 7T-7W to column lines $Y_1$-$Y_4$, respectively. The waveform applied to column line $Y_1$ lowers the voltage thereof to $-15$ volts during the interval $t_1$-$t_5$. Similarly the column lines $Y_2$-$Y_4$ are lowered to $-15$ volts during intervals $t_2$-$t_5$, $t_3$-$t_5$, $t_4$-$t_5$, respectively. The first device in the first row $X_2$ is read out by the drop in potential of the $Y_1$ line to $-15$ volts which causes charge stored in the row cell to transfer into the column cell of the first device. The transferred charge is sensed on terminal 65b connected to line $X_2$ through transistor 62. Simultaneously, any signal on line $X_1$ due to shift in voltage on the column electrode of the first device in the first row (which has been emptied of charge at the end of the previous row scan period) is sensed on terminal 65a. As terminal 65b is connected to the inverting terminal 72a of the differential amplifier 72 and as terminal 65a is connected to the inverting terminal 71a of the differential amplifier 71, an output is obtained from the amplifier 73 which is the difference of the two signals. The other devices of the rows $X_2$ and $X_1$ are similarly sensed and differential outputs obtained. This mode of sensing eliminates components in the resultant signals which are due to geometrical non-uniformities in the devices of the array and which are referred to as pattern noise.

Figure 7G:
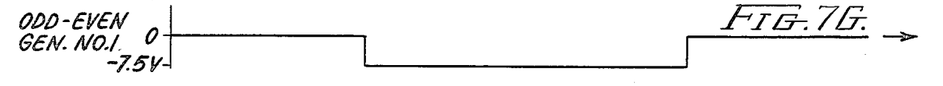
Figure 7H:
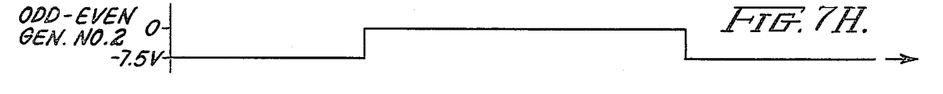
Figure 7I:
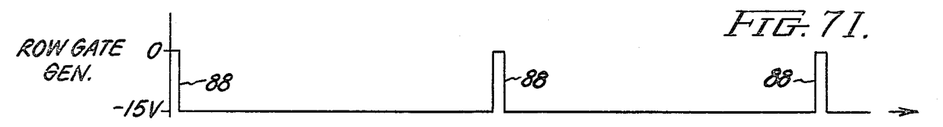
Figure 7J:
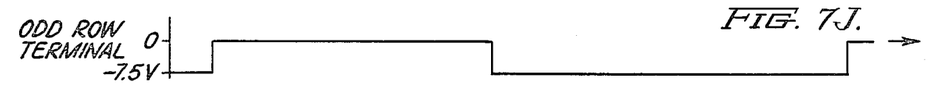
Figure 7K:
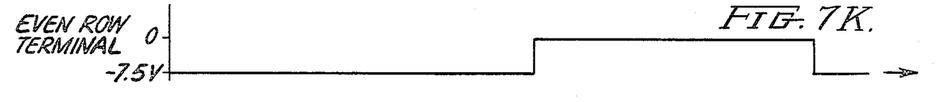
Figure 7L:
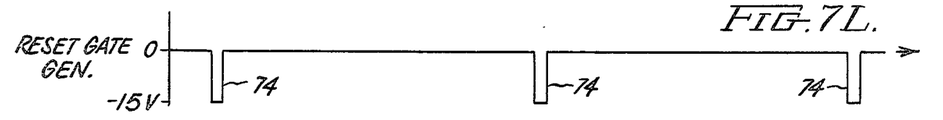

To readout the next pair of rows of devices, namely rows 3 and 2, during the next period of scan, $t_6$–$t_{10}$, readout voltages of −7.5 and zero, respectively, are provided to these lines. These voltages are provided by odd-even generator 68 through transistor switches 69a and 69b gated by reset gate generator 70. The odd-even generator is driven by X-axis clock pulses to provide an odd output, such as shown in FIG. 7G, from terminal 1 thereof and an even output, such as shown in FIG. 7H, from terminal 2 thereof. The reset gate is also driven by X-axis clock pulses to provide pulses such as pulses 74 of FIG. 7L. The sources of transistor switches 69a and 69b are connected to terminals 65a and 65b, respectively. The drains of transistor switches 69a and 69b are connected to terminals 1 and 2, respectively, of odd-even generator 68. The gates of transistor switches 69a and 69b are connected to the output of reset gate generator 70.

Prior to readout of the second and third row of devices storage voltage is re-established on all of the row lines. To this end row reset switches 83–86 are provided. The reset switches 83–86 are in the form of MOSFET transistors integrally formed on the substrate 21, each having a drain electrode connected to the other end of a respective one of the row conductor lines $X_1$–$X_4$ and each having a source electrode connected to the negative terminal source 87, the positive terminal of which is connected to ground. Each of the gate electrodes of the transistors 83–86 is driven by pulses 88 shown in FIG. 7I obtained from the output of row gate generator 89 and synchronized with the X-axis clock pulses of FIG. 7B.

Row reset gate pulse 88 appears at time $t_5$ prior to the drop in voltage of the row select waveform of FIG. 7F. Thus, all of the row lines are reset and floated with the exception of row lines $X_3$ and $X_2$ which are now connected to respective input terminals 65a and 65b. Just prior to time $t_6$ reset gate pulse 74 appears and actuates switches 69a and 69b to set terminals 65a and 65b and hence row lines $X_2$ and $X_3$ to zero and −7.5 volts, respectively, preparatory to the readout of the row $X_3$ and injection of the charge of the second row previous readout. The injection of the charge in row $X_2$ will occur concurrently with the readout of charge in row $X_3$ in the next period of scan, $t_6$–$t_{10}$.

The column lines $Y_1$–$Y_4$ are raised to zero volts in sequence as shown in FIGS. 7T–7W to provide readout of the devices of the row. During the interval $t_6$–$t_{10}$, the waveform of FIG. 7T applied to column line $Y_1$ raises the voltage thereof to zero volts. Similarly, the column lines $Y_2$–$Y_4$ are raised to zero volts during intervals $t_7$–$t_{10}$, $t_8$–$t_{10}$, $t_9$–$t_{10}$, respectively. The first device in the first row $X_3$ is read out by the rise in potential of the $Y_1$ line to zero volts which causes charge stored in the column cell to transfer into the row cell of the first device. The transferred charge is sensed on terminal 65a connected to line $X_3$ through transistor 63. Simultaneously, as the potential on line $X_2$ is zero the charge stored in the first device of the second row is injected into the substrate and a signal is obtained corresponding to an emptied device on terminal 65b. As terminal 65a is connected to the inverting terminal 71a of the differential amplifier 71 and as terminal 65b is connected to the inverting terminal 72a of the differential amplifier 72, an output is obtained from the amplifier 73 which is the difference of the two signals. Subsequent to time $t_{10}$, at the end of the period of scan of row 3, the voltage at terminal 65a and hence on row line $X_3$ is raised to zero to effect simultaneous injection of charge stored in the devices of row 3.

The manner in which the waveforms of FIGS. 7T–7W are developed will now be described. A plurality of column line drive switches in the form of MOSFET transistors 111–114 are provided. Each of the transistors 111–114 has a drain electrode connected to one end of a respective one of the column lines $Y_1$–$Y_4$. The source electrodes of the transistors 111–114 are connected to the output of column drive generator 115 which is driven by Y-axis pulses and provides the output shown in FIG. 7 O. The gate electrode of each of the transistors 111–114 is connected to respective ones of terminals 1–4 of column line scanner 116. The outputs provided at terminals 1–4 of scanner 116 are shown respectively in FIGS. 7P–7S. The voltage waveform of FIG. 7 O has a value of −15 volts over the period $t_0$–$t_5$ and a value of zero volts over the period $t_5$–$t_{10}$. Thus outputs of FIGS. 7P–7S appearing in sequence on the gates of transistors 111–114 and lower the potential of lines $Y_1$–$Y_4$ in sequence to −15 volts during the period $t_0$–$t_5$ and raise the potential of lines $Y_1$–$Y_4$ in sequence to zero volts during the period $t_5$–$t_{10}$.

Figure 7M:
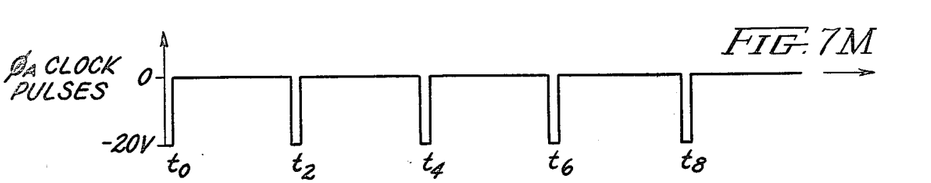
Figure 7N:
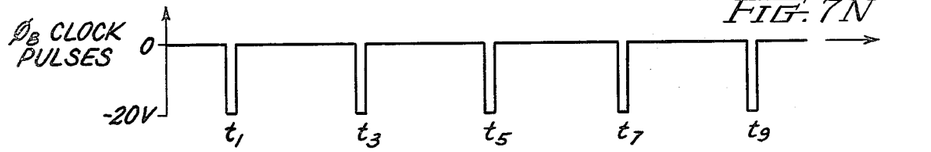
Figure 7O:
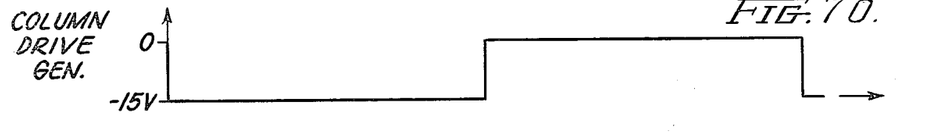
Figure 7P:
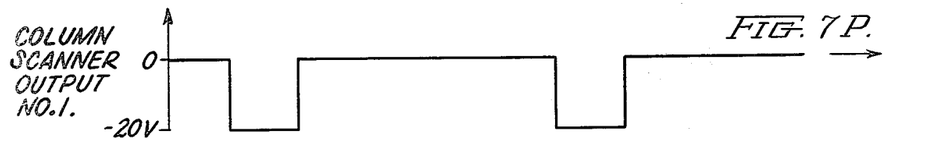
Figure 7Q:
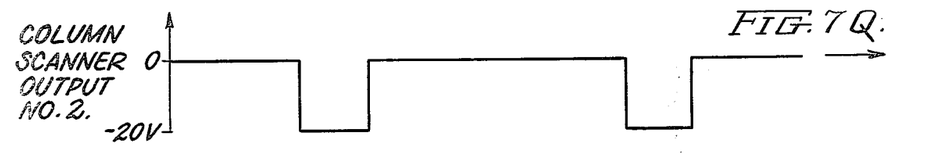
Figure 7R:
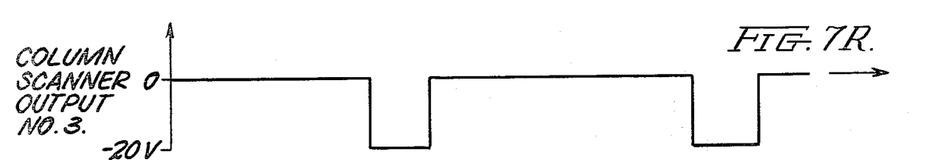
Figure 7S:
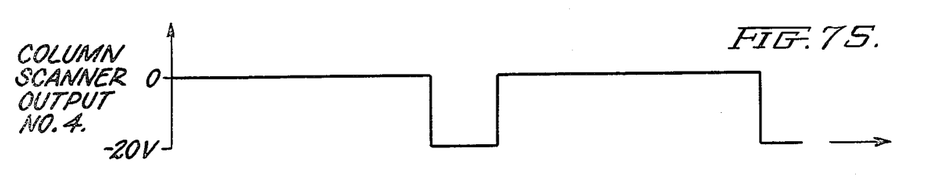
Figure 7T:
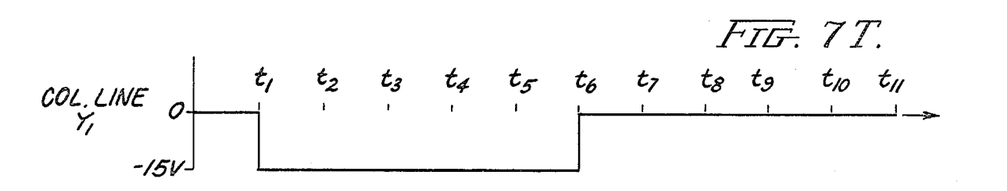
Figure 7U:
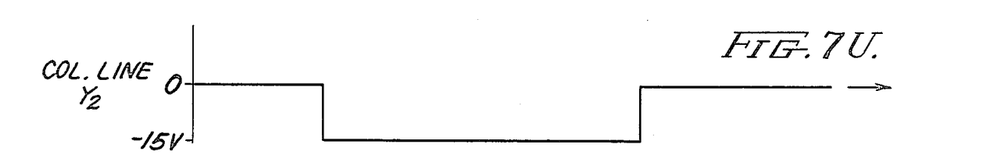
Figure 7V:
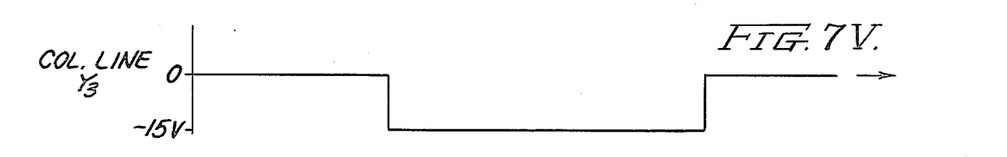
Figure 7W:
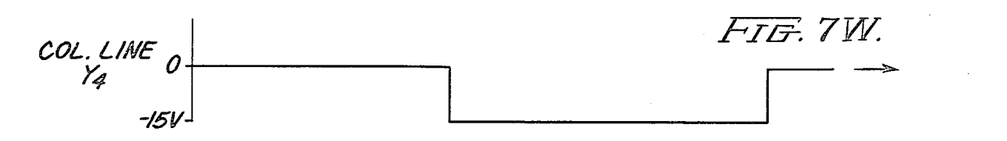

To provide the outputs of FIGS. 7P–7S at the terminals 1–4 of the column scanner 116, line synchronizing pulses from the output of counter 53 are applied to the input of the column scanner 116 and, in addition, pulses from the $\phi_A$ generator 118 and the $\phi_B$ generator 119, shown respectively in FIGS. 7M and 7N are applied. The $\phi_A$ generator 118 applies the even numbered pulses of the clock pulse generator 51 to the column scanner 116 and the $\phi_B$ generator 119 applies the odd numbered pulses of the clock pulse generator 51 to the column scanner 116. From the applied input information the column scanner develops the outputs 7P–7S at the output terminals 1–4 thereof.

Figure 7X:
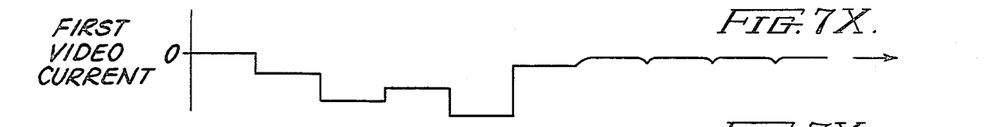
Figure 7Y:
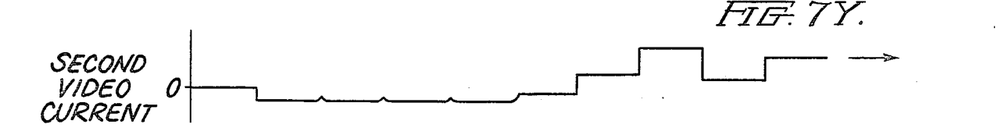
Figure 7Z:
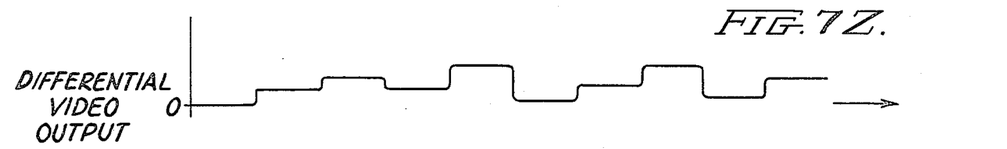

The scanning of the devices of the second and third rows of the array in accordance with the present invention provides a first video signal at terminal 65b, as shown in FIG. 7X and also provides a second video signal at terminal 65a, as shown in FIG. 7Y. On the basis of the assumption that the charge levels in the devices of the second row are in the relative proportions of 1, 3, 2, 4, respectively, and the charge levels of the devices in the third row are in the relative proportions 2, 4, 1, 3, respectively, the first video current on terminal 65b for the two rows is as shown in FIG. 7X and the second video current on terminal 65a for the two rows is as shown in FIG. 7Y. The portion of the signal of FIG. 7X occurring in the time period $t_1$–$t_5$ represents the signal sensed in the filled devices of the second row and the portion of the signal of FIG. 7X occurring in the time period $t_6$–$t_{10}$ represents the signal sensed in the empty devices of the second row. The portion of the signal of FIG. 7Y occurring in the time period $t_1$–$t_5$ represents the signal sensed in empty devices of the first row and the portion of the signal of FIG. 7Y occurring in the time period $t_6-t_{10}$ represents the signal sensed in the filled devices of the third row. The amplifier 72 inverts the first video signal and amplifier 71 inverts the second video signal. The output of amplifier 72 is applied to the non-inverting terminal of amplifier 73 and the output of amplifier 71 is applied to the inverting terminal of amplifier 73. Thus, the difference of the first and second video signals is obtained at the output of amplifier 73. Since charge is transferred from row site to column site during the period $t_1-t_5$ of FIG. 7X and from column site to row site during period $t_6-t_{10}$ of FIG. 7Y, the video current at terminals 65a and 65b reverses polarity during the time period $t_5-t_6$. This produces a video output of constant polarity at amplifier 73, as shown in FIG. 7Z.

In the operation of the apparatus of FIG. 6, the voltage of the row line source 87, which is indicated as $-7.5$ volts establishes the charge storage capability of the row connected cells of each of the devices of the array and the output of column drive generator 115, waveform of FIG. 7 O, of $-15$ volts establishes the charge storage capability of the column connected cells of each of the devices of the array. Under the control of the clock pulse generator 51, frame synchronizing pulses, such as shown in FIG. 7C, are applied to the row scanner 81. Row line gating pulses, three of which are shown for lines $X_1$, $X_2$, and $X_3$ in FIGS. 7D, 7E and 7F, respectively, are derived at the output points 1-3 of the row scanner 81 in response to row line rate clocking of the row scanner by the X-axis clock pulses of FIG. 7B. The row line gating pulses are utilized to gate in sequence the row enable switches 61-64 to connect in overlapping sequence row lines $X_1$ and $X_3$ to terminal 65a and to connect in overlapping sequence row lines $X_2$ and $X_4$ to terminal 65b, and hence to the differential amplifiers 71 and 72 for readout.

Consider now the manner in which charge in the second row of devices is read out starting at time $t_1$. Lines $X_1$ and $X_2$ are connected respectively to inverting terminal 71a of differential amplifier 71 and to inverting terminal 72a of differential amplifier 72. The other row lines are at storage voltage of $-7.5$ volts and all of the column lines $Y_1-Y_4$ are at zero volts. The column lines $Y_1-Y_4$ are lowered in sequence at times $t_1-t_4$ to $-15$ volts as shown in FIGS. 7T-7W by application of the gating pulses of FIGS. 7P-7S in sequence to respective transistors 111-114. The signal current which is caused to flow in row line $X_2$ as a result of this action is shown in FIG. 7X and the signal current which is caused to flow in row line $X_1$ is shown in FIG. 7Y. The differential of the signal currents appearing on lines $X_1$ and $X_2$ appears at the output of the differential amplifier, shown in FIG. 7Z. Thus, a row cycle of scan has been accomplished. In preparation for the next cycle of row scan, storage potential is reapplied to the row lines $X_1-X_4$ by application of row gate pulses 88 of FIG. 7I to row reset transistors 83-86, while the voltage on column lines $Y_1-Y_4$ remain at $-15$ volts. Row enable switch 61 for the first row is opened and the row enable switch 63 for the third row is closed, while switch 62 remains closed. Thus, line $X_2$ remains connected to terminal 65b and line $X_3$ is now connected to terminal 65a. Row switches 69a and 69b are activated by reset gate generator waveform of FIG. 7L, thus momentarily connecting terminals 65a and 65b, to terminals 1 and 2 of odd-even generator 68 which are now at $-7.5$ volts and 0 volts, respectively. Thus, a potential of $-7.5$ volts is established on line $X_3$ and a potential of zero volts is established on line $X_2$.

The charge stored in the third row of devices is read out starting at time $t_6$. Line $X_2$ remains connected to inverting terminal 72a and now is at zero volts. Line $X_3$ is now connected to inverting terminal 71a and is at $-7.5$ volts. All of the column lines $Y_1-Y_4$ are at $-15$ volts at time $t_6$. The column lines $Y_1-Y_4$ are raised in sequence at times $t_6-t_{10}$ to zero volts, as shown in FIGS. 7T-7W by application of the gating pulses of FIGS. 7P-7S in sequence to respective transistors 111-114. The signal current which is caused to flow in row line $X_2$ as a result of this action, is shown in FIG. 7X and the signal current which is caused to flow in row line $X_3$ is shown in FIG. 7Y. The resultant video output is shown in FIG. 7Z.

Storage potential is reapplied to the row lines $X_1-X_4$ by application of row gate pulses 88 of FIG. 7I to row reset transistors 83-86, while the voltage on column lines $Y_1-Y_4$ is at zero volts. Row enable switch 62 for the second row is opened and the row enable switch 64 in the fourth row is closed, while switch 63 remains closed. Thus, line $X_3$ remains connected to terminal 65a and line $X_4$ is connected to terminal 65b. Row switches 69a and 69b are activated by reset gate waveform of FIG. 7L, thus momentarily connecting terminals 65a and 65b to terminals 1 and 2 of odd-even generator 68 which are now at zero volts and $-7.5$ volts, respectively. At this time, $t_{10}-t_{11}$, as the column lines $Y_1-Y_4$ are at ground and the row line $X_3$ is at ground, all of the charge stored in the devices of the third row are injected into the substrate. Thus, the devices of third and fourth rows are ready for readout and readout is accomplished in the same manner as the readout of the devices of the first and second rows.

An advantage of the apparatus of FIG. 6 and the mode of readout described is that disturbance of the potential of storage layer 21a (FIG. 2) due to changes in the voltage of the column lines $Y_1-Y_4$ which are coupled to the row lines $X_1-X_4$ is minimized. In the aforementioned patent application Ser. No. 060,850, apparatus and modes of readout thereof are described and claimed in which periodically all of the column line voltages are changed either to effect the injection of stored charge into the substrate or to preset the column lines for readout of a row. Such a change in the voltage on all of the column lines produces a transient voltage on the storage layer 21a which can degrade the performance of the apparatus. In the present invention, any degradation is minimized as column line voltages always change in sequence and not simultaneously, and hence only one column line at a time is coupled to the storage layer 21a.

Another advantage of the apparatus of the present invention is that the video output of amplifier 73 is of same polarity for the readout of each of the rows of devices. In the aforementioned patent application Ser. No. 060,850, charge is transferred in the same direction between cells for readout of each of the rows of devices. Since the differential amplifier configuration (amplifiers 71, 72 and 73) inverts the first video signal at terminal 65b once, and inverts the second video signal at terminal 65a twice, the video output reverses polarity after each row readout. Consequently, additional circuitry must be included to provide video output of uniform polarity. The polarity reversal is done automatically in the apparatus of the present invention as charge is transferred in opposite direction after each row readout.

While the invention has been described in connection with an array of sixteen devices, it is apparent that the invention is particularly applicable to arrays including devices many orders of magnitude greater in number than sixteen.

While the invention has been described in a specific embodiment, it will be understood that modifications may be made by those skilled in the art, and it is intended by the appended claims to cover all such modifications and changes as fall within the true spirit and scope of the invention.

What I claim as new and desire to secure by Letters Patent of the United States is:

1. In combination, a substrate of semiconductor material having a major surface, a plurality of first conductive plates, each overlying and in insulated relationship to said major surface and forming a first conductor-insulator-semiconductor capacitor with said substrate, a plurality of second conductive plates, each adjacent a respective first conductive plate to form a plurality of pairs of plates, said pairs of plates being arranged in a matrix of rows and columns, each of said second conductive plates overlying and in insulated relationship to said major surface and forming a second conductor-insulator-semiconductor capacitor with said substrate, each coupled to a respective first conductor-insulator-semiconductor capacitor, a plurality of row conductor lines, the first conductive plates in each of said rows connected to a respective row conductor line, a plurality of column conductor lines, the second conductive plates in each of said columns connected to a respective column conductor line, a first voltage means for providing a first voltage between said row conductor lines and said substrate to deplete the first portions of said substrate lying under said first conductive plate of majority charge carriers and provide an absolute potential of a first value therein, a second voltage means for providing a second voltage between said column conductor lines and said substrate to deplete the second portions of said substrate lying under said second conductive plate of majority carriers and providing an absolute potential of a second value therein, said second value being greater than said first value, means for storing charge in said first and second portions of said substrate, means for addressing each pair of adjacent rows in sequence during a respective first period of time, each row being included in two successive pairs of rows whereby each row is addressed during an initial first period and also during a succeeding first period thereof, means for providing each of the lines of an addressed pair of rows with said first voltage during said initial first period thereof and with a zero reference potential during said succeeding first period thereof, said column lines being set at zero reference voltage at the beginning of the initial first period of a row of said addressed pair, the row line of the preceding row of said addressed pair being reduced to zero reference potential at the beginning of the initial first period of said one row causes charge in the first storage regions of said preceding row to be injected simultaneously into said substrate, means for increasing said second voltage on each of said column conductor lines in sequence during said initial first period of said one row when the row line thereof is at said first voltage and the preceding row line of said pair is at zero reference potential to deplete a respective pair of second portions of said substrate lying thereunder of majority charge carriers to provide an absolute potential in said second portions of said second value therein whereby charge stored in said first portions of said row of said addressed pair of rows is transferred in sequence into respective second portions thereof and produces a video signal of one polarity on the row line thereof and whereby another video signal of said one polarity is produced on the preceding row line of said addressed pair, means for decreasing said second voltage on each of said column conductor lines in sequence during an initial first period of a succeeding row of a succeeding addressed pair of rows to zero reference potential when the row line thereof is at said first voltage and said one row line is at zero reference potential whereby charge stored in the second portions of said succeeding row is transferred in sequence into respective first portions thereof and produces a video signal of opposite polarity on the row line thereof and whereby another video signal of said opposite polarity is produced on said one row line, said one row line being at said zero reference potential and each of said column conductor lines being reduced in sequence to zero reference potential causes charge in each of the second storage regions of said one row to be injected in sequence into said substrate, means for sensing in sequence the signals induced on each of the row lines of said addressed pair during the transfer of charge from the second portions to the first portions of said substrate associated therewith, means for obtaining a difference signal for each pair of signals appearing on the row lines of said addressed pair of rows.

* * * * *